US008658986B1

(12) United States Patent
Jerez et al.

(10) Patent No.: US 8,658,986 B1
(45) Date of Patent: Feb. 25, 2014

(54) ION SOURCE ASSEMBLY

(71) Applicants: Manuel A. Jerez, Roosevelt, NY (US); Carlos F. M. Borges, Roslyn Estates, NY (US)

(72) Inventors: Manuel A. Jerez, Roosevelt, NY (US); Carlos F. M. Borges, Roslyn Estates, NY (US)

(73) Assignee: ion Technology Solutions, LLC, Mineola, NY (US)

( * ) Notice: Subject to any disclaimer, the term of this patent is extended or adjusted under 35 U.S.C. 154(b) by 0 days.

(21) Appl. No.: 13/649,652

(22) Filed: Oct. 11, 2012

(51) Int. Cl.
*H01J 27/00* (2006.01)

(52) U.S. Cl.
CPC ..................................... *H01J 27/00* (2013.01)
USPC ...................................... 250/426; 250/423 R

(58) Field of Classification Search
USPC .............................................. 250/426, 423 R
See application file for complete search history.

(56) References Cited

U.S. PATENT DOCUMENTS

| 5,554,852 | A  | * | 9/1996  | Bright et al.     | 250/492.21 |
| 6,525,482 | B2 | * | 2/2003  | Miyamoto          | 315/111.81 |
| 7,435,971 | B2 | * | 10/2008 | Vanderberg et al. | 250/423 R  |
| 8,253,334 | B2 | * | 8/2012  | Jerez             | 313/613    |

* cited by examiner

*Primary Examiner* — Kiet T Nguyen
(74) *Attorney, Agent, or Firm* — Francis C. Hand; Carella, Byrne et al.

(57) ABSTRACT

The second repeller assembly includes a flat plate and two sleeves through which the legs of a filament pass in electrically insulated manner. The clamp assembly for the filament includes a pair of strap assemblies with three straps each for electrically connecting the clamps and filament to an electrical feed. The straps are in contact with opposite flat sides of a terminal pin.

12 Claims, 6 Drawing Sheets

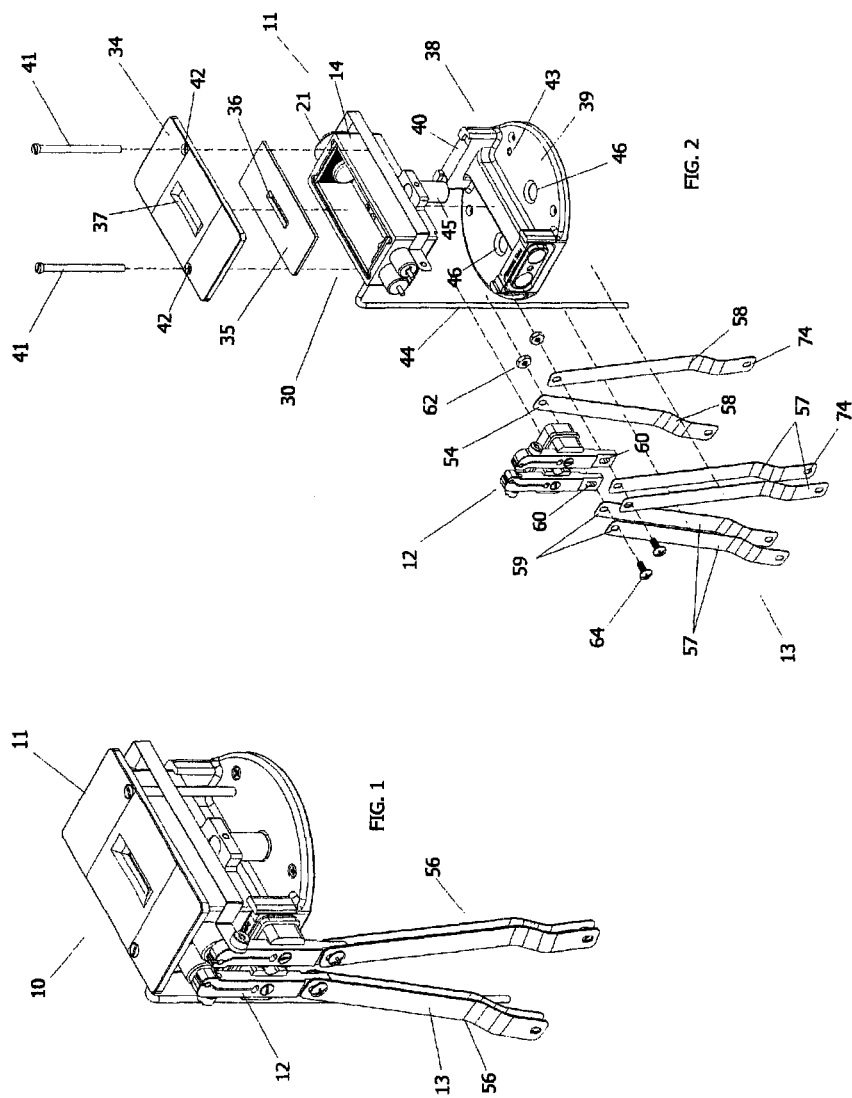

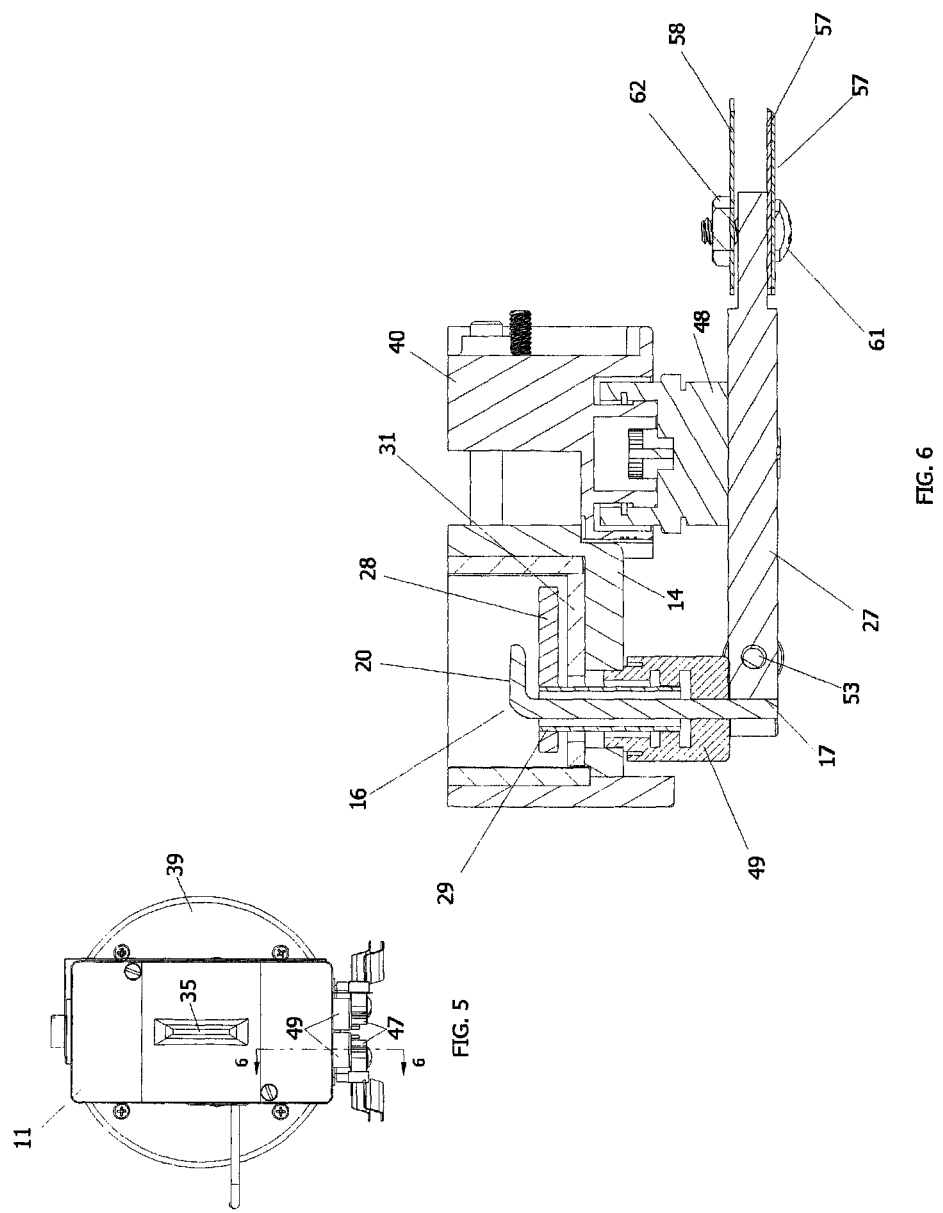

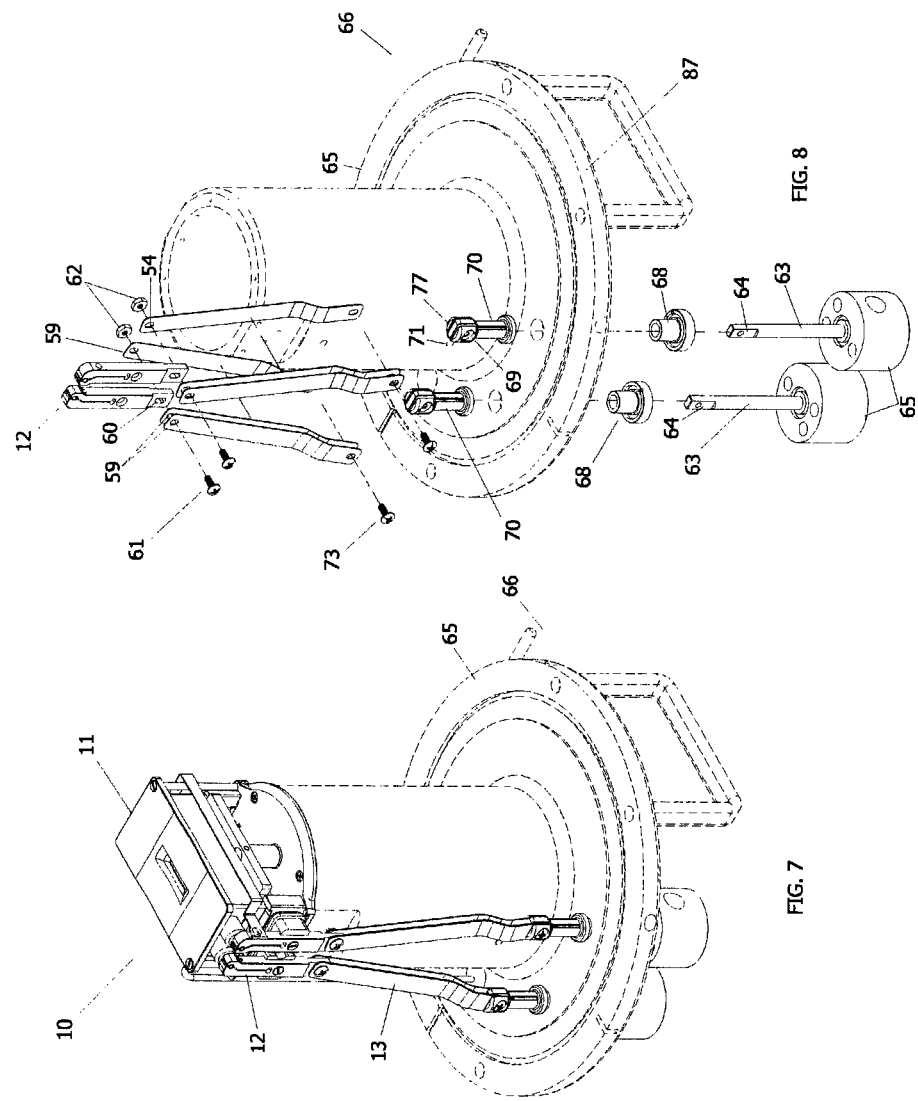

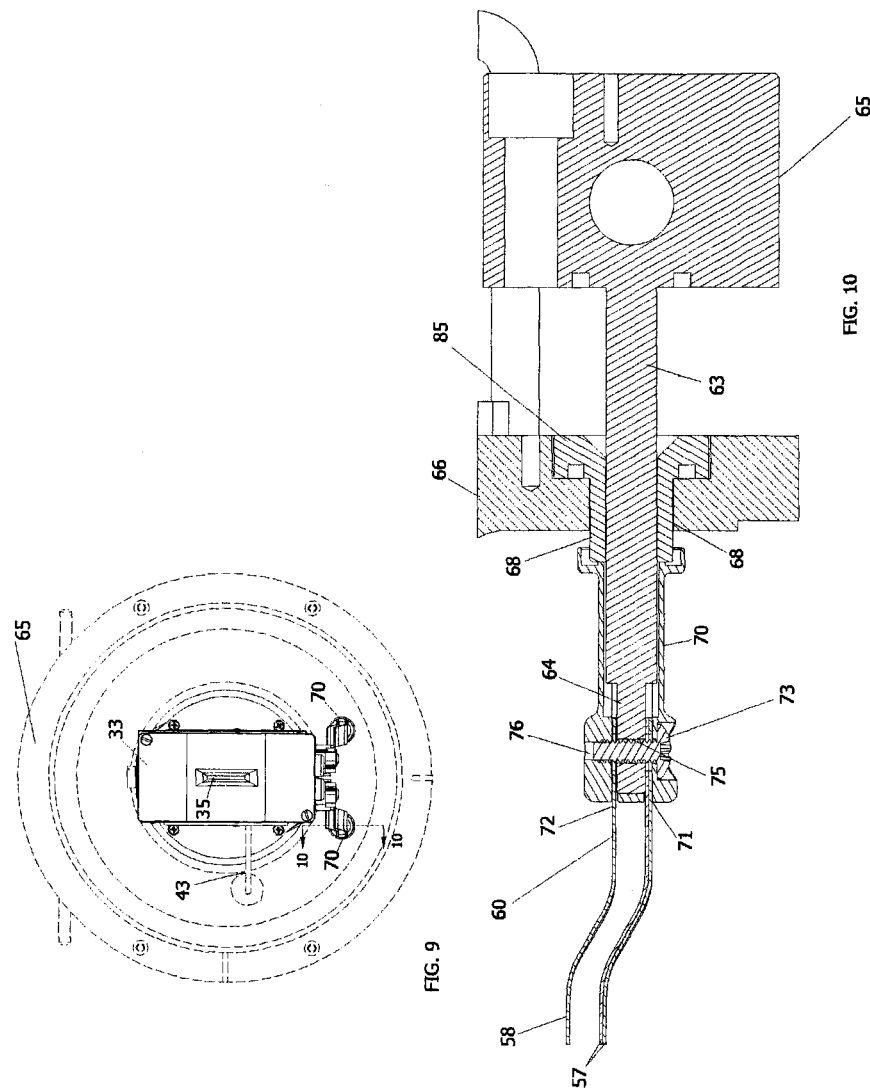

ION SOURCE ASSEMBLY

This invention relates to an improved ion source assembly. More particularly, this invention relates to ion sources typically used in ion implanters.

As is known, in the manufacture of semi-conductors, ion implanters are widely used to diffuse or implant positive ions onto regions of a semi-conductor wafer. These ion implanters use an ion source that generates an ion beam used to implant the semi-conductor wafers. The ion implanters may be of the indirectly heated cathode ion source type or a directly heated cathode type. As is known, in the manufacture of semi-conductors, ion implanters are widely used to diffuse or implant positive ions onto regions of a semi-conductor wafer. These ion implanters use an ion source that generates an ion beam used to implant the semi-conductor wafers. The ion implanters may be of the indirectly heated cathode ion source type or a directly heated cathode type.

As is also known, an indirectly heated cathode ion source includes an arc chamber, cathode assembly, filament, insulator block, graphite support plate, and a filament clamp assembly. The filament is positioned within a cavity defined by the cathode assembly and a cathode within the cathode assembly is heated by an electron bombardment from the filament. The cathode, in turn, emits electrons thermionically for generating a plasma along with a specific gas species within the arc chamber. An example of such an indirectly heated cathode ion source is described in co-pending U.S. patent application Ser. No. 12/655,347, filed Dec. 29, 2009.

A directly heated cathode generally includes an arc chamber, filament clamp assembly, and a filament positioned inside the arc chamber. The filament emits electrons thermionically for generating a plasma along with a specific gas species within the arc chamber.

Various techniques have also been known for increasing the efficiency of ion inplantation equipment, such as described in U.S. Pat. No. 5,554,852, by providing a filament reflector opposite a filament inside of an arc chamber for reflecting electrons and, as described in U.S. Pat. No. 6,525,482, by providing two reflectors at opposite ends of an arc chamber for reflecting electrons.

Various techniques have also been known for connecting the filament of an ion source to an electrical supply. For example, filaments have been mounted in clamps that arte electrically connected to copper feeds using a single sterling silver strap per clamp.

It is an object of the invention to increase the efficiency of an ion source assembly.

It is another object of the invention to increase ionization within an arc chamber of an ion source.

It is another object of the invention to improve the electrical connections to a filament of an ion source.

Briefly, the invention provides an ion source for an ion implanter that has an improved arrangement of a second impeller assembly relative to a filament.

The invention is directed to an ion source having a housing defining an arc chamber with a pair of openings at one end thereof; a filament mounted in the arc chamber with a pair of legs extending through the openings of the housing; and a clamp assembly mounting the legs of said filament therein in electrically conductive relation. In addition, the ion source has a first repeller assembly mounted in the housing opposite the filament and a second repeller assembly mounted in the housing at the same end as the filament.

In accordance with the invention, the second repeller assembly includes a flat plate, a first sleeve of a predetermined inside diameter extending through one of the openings in the housing and in spaced concentric relation to a first leg of the filament and a second sleeve of an inside diameter less than said predetermined diameter extending through a second of the openings in the housing and in spaced concentric relation to a second leg of the filament.

In addition, a first electrically insulating bushing is mounted in a first opening of the housing to receive the first leg of the filament and the first sleeve of the second repeller assembly and a second electrically insulating bushing is mounted in a second opening of the housing to receive he second leg of the filament and the second sleeve of the second repeller assembly.

The invention also provides an improved electrical feed for supplying current to the filament. In this respect, the clamp assembly includes a pair of clamps electrically connected to the legs of the filament and a pair of strap assemblies for electrically connecting the clamps to an electrical feed for supplying current to each said strap assembly.

In accordance with the invention, each strap assembly has a pair of straps secured to one side of a clamp and a third strap secured to an opposite side of a clamp.

The electrical feed includes a pair of copper feeds, each of which includes a terminal pin having a flat end and a shield concentrically mounted about the flat end of the pin with a pair of slots in the shield. One slot of each shield receives the pair of straps of a strap assembly in contact with the flat end of a pin while the second slot receives the third strap of a strap assembly in contact with the flat end of a pin.

A screw is threaded into each shield of a cooper feed to pass through the straps and the flat end of the pin therein to secure the straps to the shield and the pin.

These and other objects and advantages of the invention will become more apparent from the following detailed description taken in conjunction with the accompanying drawings wherein:

FIG. 1 is a perspective view of an ion source constructed in accordance with the invention;

FIG. 2 is a partially exploded perspective view of the ion source in FIG. 1;

FIG. 5 is a top view of the ion source of FIG. 1;

FIG. 6 is a cross sectional view taken through the line 6-6 of FIG. 5;

FIG. 7 is an isometric view of the electrical feed for the ion source of FIG. 1 in accordance with the invention;

FIG. 8 is a partially exploded view of the electrical feed of FIG. 7;

FIG. 9 is a top view of ion source of FIG. 7; and

FIG. 10 is a cross sectional view taken through line 10-10 of FIG. 9.

Referring to FIGS. 1 and 2, the ion source assembly 10 for an ion implanter includes an arc chamber assembly 11, a filament clamp assembly 12 and an electrical feed 13 and operates to produce an ion beam used to implant semi-conductor wafers.

Figure 3:
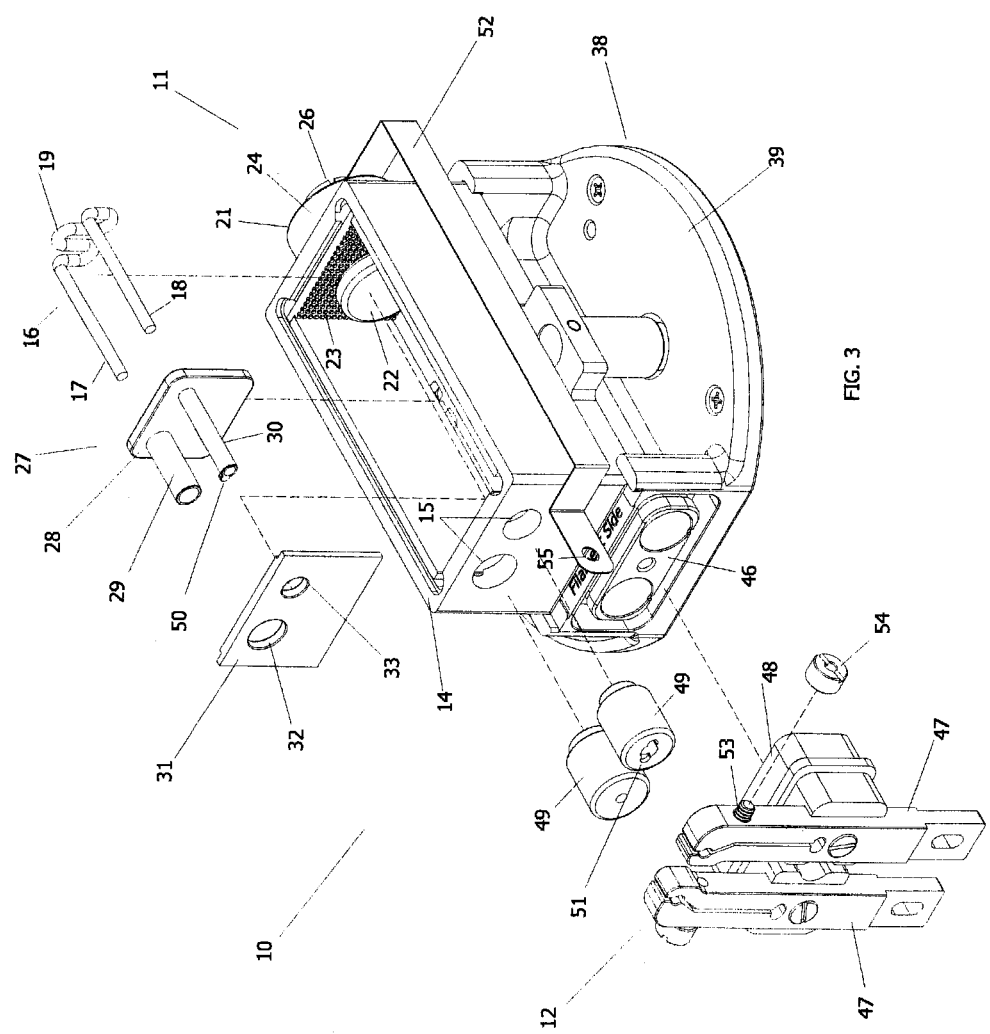
FIG. 3 is a partially exploded perspective view of the ion source constructed in accordance with the invention.
Figure 4:
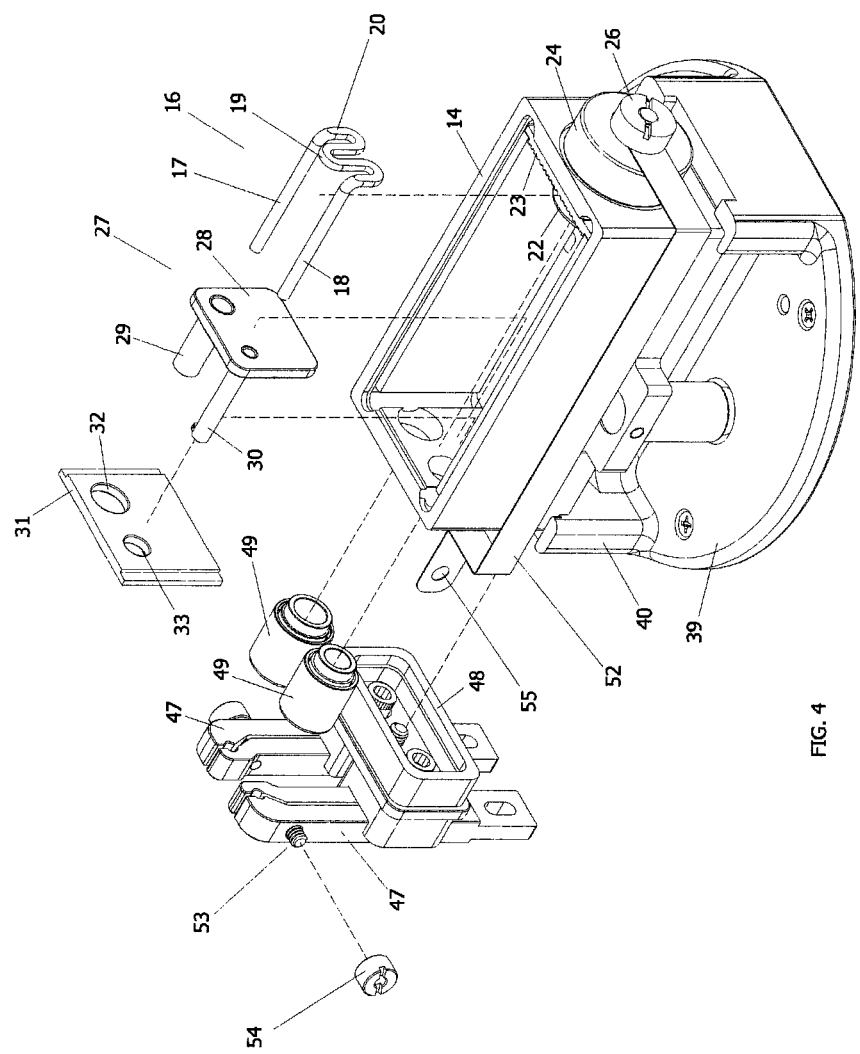
FIG. 4 is a partially exploded perspective view similar to FIG. 3 of the ion source constructed in accordance with the invention.

Referring to FIGS. 3 and 4, the arc chamber assembly 11 includes a housing 14 of box shape to define an arc chamber with a pair of openings 15 at one end and may be otherwise constructed as disclosed in US patent application entitled Improved Ion Source filed on even date herewith.

The arc chamber assembly 11 also includes a filament 16 that is mounted in the arc chamber of the housing 14 and that has a pair of legs 17, 18 extending through the openings 15 of the housing. Each leg 17, 18 is cylindrical and of the same diameter as the other leg. In addition, the filament 16 has a serpentine section 19 between the pair of legs 17,18 having a cross-section smaller than the cross-section of each leg 17, 18 and that has a flat ground surface 20 facing into the housing 14. The smaller cross section of the serpentine section 19 makes the ground flat surface 20 the primary emitter on the filament 16 thereby increasing the efficiency of the ion source assembly 10.

The arc chamber assembly 11 also includes a first repeller assembly 21 of a construction as described in U.S. Pat. No. 8,253,334 mounted in the housing 14 at an end opposite the filament 16. The repeller assembly 21 consists of a repeller 22, a liner 23, a tubular shield 24, an insulator (not shown) and a lock nut 26. The tubular shield 24 is threadably secured in and projects outwardly from an opening in the housing 14.

In addition, the arc chamber assembly 11 includes a second repeller assembly 27 mounted in the housing 14 at an end opposite the first repeller assembly 21. This repeller assembly 27 includes a flat plate 28 and a pair of sleeves 29, 30 that are integral with the plate 28. The plate 28 and sleeves 28, 29 are made of tungsten or any other suitable material.

The sleeves 28, 29 of the second repeller assembly 26 are of different inside diameters.

The sleeves 28, 29 extend through the openings 15 in the housing 14 in spaced concentric relation to the legs 17, 18 of the filament 16.

As is conventional, a shield 31 is positioned in the housing 14 at the end wall of the housing 14 with openings 32, 33 coaxial with the openings 15 in the housing and sized to permit passage of the sleeves 28, 29 of the second repeller assembly 26 with a small annular clearance.

Referring to FIG. 2, the arc chamber assembly 11 includes, in known manner, a removable cover 34 on the housing 14 that is provided with a liner 35 on the underside. As indicated, the liner 35 has a central slit 36 and the cover 34 has a central slit 37 that functions as an arc slit for passage of an ion beam.

As indicated in FIG. 2, the arc chamber assembly 11 is mounted on a mount 38 of conventional structure having a circular mounting plate 39 on which an H-shaped pedestal 40 is carried. The pedestal 40 is shaped to receive the arc chamber assembly 11 in seated relation while a pair of elongated bolts 41 are provided to pass through holes 42 in the cover 34 into threaded relation in threaded holes 43 (only one of which is shown) in the mounting plate 39 in order to secure the arc chamber assembly 11 to the mount 38 thus ensuring perfect alignment and sealing between the arc slit 37 and the arc chamber.

A gas supply line 44 is also connected in known manner to the housing 14 in order to deliver a gas into the housing 14. Also, a pair of inlet ports 45 (only one of which is shown) are provided on the underside of the housing 14 to fit into openings 46 in the mounting plate 39 for the delivery of gas. One inlet port 45 typically delivers a gas from a compressed gas cylinder while the other port typically delivers a gas from a vaporized solid and is usually of smaller diameter.

Referring to FIGS. 3 and 4, the filament clamp assembly 12 mounts the filament 16 in the housing 14 in a fixed precise position in order to generate an ion beam. As illustrated, the clamp assembly 12 includes a pair of clamps 47 that are electrically conductive and are disposed in parallel relation with each having a bifurcated end to receive the ends of the legs 17, 18 of the filament 16.

The clamps 47 are secured to a mounting block 48 to form a unit that is, in turn, mounted on the pedestal 40 of the mount 38 in known manner.

As illustrated, a pair of electrically insulated bushings 49 is mounted between the clamps 47 and the housing 14 to electrically isolate the clamps from the housing 14 as well as the second repeller assembly 27.

Referring to FIGS. 3, 5 and 6, one bushing 49 is mounted in fitted relation in one opening 15 in the housing 14 and receives one leg 17 of the filament 16 and the larger diameter sleeve 29 of the second repeller assembly 27. As illustrated n FIG. 6, the sleeve 29 is recessed within the bushing 49.

The other bushing 49 is rotatably mounted in the second opening 15 in the housing and receives the second leg 18 of the filament 16 and smaller diameter sleeve 30 of the second repeller assembly 27.

As illustrated in FIG. 3, the smaller diameter sleeve 30 of the second repeller assembly 27 has a projecting tab 50 at the end for fitting into a recess 51 in the receiving bushing 49. In this regard, the opening 33 in the shield 31 and the opening 15 in the housing 14 through which the sleeve 30 passes are each of a diameter to allow passage of the sleeve 30 and tab 50 during assembly. In addition, the rotatable bushing 49 that receives the sleeve 30 has a central bore with a groove 51' that extends longitudinally to allow sliding of the tab 50 through the bushing 49. After positioning of the sleeve 30 within the bushing 49, the bushing 49 is rotated 180° to align the recess 51 in the bushing 49 with the tab 50.

Upon subsequent mounting of the clamps 47 to the mounting block 48, the end of the sleeve 30 is pushed towards the housing 14 so that the tab 50 is moved into the recess 51 in the bushing 49 thereby locking the sleeve 30 and the second repeller assembly 27 in a fixed position.

In addition, a cathode strap 52 is mounted on a threaded stud 53 on the side of a clamp 47 by a threaded nut 54 and extends to the first repeller assembly 21. As illustrated, the strap 52 is fitted between the shield 24 and lock nut 26 of the first impeller assembly 21 (see FIG. 4) and has an aperture 55 at the opposite end for fitting over the stud 53 on a clamp 47 (see FIG. 3).

Referring to FIGS. 1 and 2, the electrical feed 13 includes a pair of strap assemblies 56, each of which is electrically connected to a respective clamp 47. As illustrated, each strap assembly 56 includes a pair of straps 57 secured to one side of a clamp 47 and a single strap 58 secured to an opposite side of the clamp 47. As indicated in FIGS. 2 and 6, the three straps 57, 58 of each strap assembly 56 each have a hole 59 near the top that is aligned with an aperture 60 in the base of a clamp 47. A threaded bolt 61 passes through the holes 59 in the straps 57, 58 and the aperture of a clamp 47 and receives a lock nut 62 in order to secure the straps 57, 58 to the base of each clamp 47 in electrically conductive manner.

Referring to FIGS. 7 and 8, the electrical feed 13 for supplying current to the strap assemblies 56 includes a pair of terminal pins 63, each having a flat end 64 mounted on a base 65 that functions as a cooper feed. As illustrated, the two bases 65 are mounted to the underside of a circular table 66 of a tool 67 on which the ion source assembly 10 is mounted.

Referring to FIGS. 8, 9 and 10, each upstanding pin 63 passes through an apertured insulating cap 68 that is mounted in an aperture 69 of the table 66 and that passes into abutment with the base of a tubular shield 70 disposed on the upper side of the table 66.

Each tubular shield 70 is of split sleeve construction and is concentrically mounted about a respective pin 63. Each shield 70 has a pair of slots 71, 72 at the upper end. One slot 71 receives the pair of straps 57 while the other slot 72 receives the single strap 58.

A threaded bolt 73 passes through a smooth bore 69 in one side of the shield 70, holes 74 in the straps 57, 58 and a smooth bore 75 in the flat end 64 of the pin 63 into a threaded bore 76 in an opposite side of the shield 70 in order to clamp the straps 57, 58 to the flat end 64 of the pin 63 in electrically conductive relation by constricting the end of the split tubular shield 70 (see FIG. 10).

The straps 57, 58 are thus secured to the pins 63 with an increased contact surface for increased electrical conductivity.

The terminal pin 63 and base 66 are reduced in mass to reduce manufacturing costs.

In addition to increasing the efficiency of ion flow by introducing a second charged repeller, the invention provides for an increased ionization within the arc chamber by introducing the second charged repeller without the need for an external power supply as the reflector of the second charged repeller uses the negative voltage of the filament power supply to reflect the electrons back to the plasma.

The invention also provides an ion source assembly having improved filament strap connections and allows the continuous running time of an ion implanter to be extended by improving the efficiency of the ion source.

The invention provides for a secure fastening of the arc slit of the ion source to ensure proper alignment and reduce plasma loss from the arc chamber to improve the assembly of the arc slit and arc chamber to an ion implanter.

What is claimed is:

1. An ion source for an ion implanter comprising
   a housing defining an arc chamber, said housing having a pair of openings at one end thereof;
   a filament mounted in said arc chamber, said filament having a pair of legs extending through said openings of said housing;
   a clamp assembly mounting said legs of said filament therein in electrically conductive relation;
   a first repeller assembly mounted in said housing at second end opposite said filament and said one end;
   a second repeller assembly mounted in said housing at said one end, said second repeller assembly including a flat plate, a first sleeve of a predetermined inside diameter extending through one of said openings in said housing and in spaced concentric relation to a first of said legs of said filament and a second sleeve of an inside diameter less than said predetermined diameter extending through a second of said openings in said housing and in spaced concentric relation to a second of said legs of said filament;
   a first electrically insulating bushing mounted in a first opening of said pair of openings in said housing and receiving said first leg of said filament and said first sleeve of said second repeller assembly therein; and
   a second electrically insulating bushing mounted in a second opening of said pair of openings in said housing and receiving said second leg of said filament and said second sleeve of said second repeller assembly therein.

2. An ion source as set forth in claim 1 wherein said second sleeve of said second impeller assembly has a tab at an end thereof and said second insulating bushing has a recess at an end facing said clamp assembly receiving said tab.

3. An ion source as set forth in claim 1 wherein said flat plate of said second repeller assembly is made of tungsten.

4. An ion source as set forth in claim 1 wherein said filament has a serpentine section between said pair of legs having a cross-section smaller than the cross-section of each said leg of said pair of legs.

5. An ion source as set forth in claim 4 wherein said serpentine section has a flat surface facing said first repeller assembly.

6. An ion source as set forth in claim 1 wherein said clamp assembly includes a pair of electrically conductive clamps electrically connected to said legs of said filament and a pair of strap assemblies, each said strap assembly being electrically connected to a respective clamp of said pair of clamps.

7. An ion source as set forth in claim 6 wherein each strap assembly includes a pair of straps secured to one side of a respective clamp of said pair of clamps and a third strap secured to an opposite side of a respective clamp of said pair of clamps.

8. An ion source as set forth in claim 7 further comprising an electrical feed for supplying current to each said strap assembly.

9. An ion source as set forth in claim 8 wherein said electrical feed includes a terminal pin having a flat end; and a shield concentrically mounted on said pin and having a pair of slots therein; said shield having said pair of straps received in a first of said slots and in contact with said flat end and said third strap received in a second of said slots and in contact with said flat end.

10. In an ion source, the combination of
    a filament having a pair of legs;
    a clamp assembly mounting said legs of said filament therein in electrically conductive relation; said clamp assembly including a pair of electrically conductive clamps electrically connected to said legs of said filament and a pair of strap assemblies, each said strap assembly including three straps electrically connected to a respective clamp of said pair of clamps; and
    a pair of copper feeds for supplying electrical current, each said cooper feed being electrically connected to a respective one of said strap assemblies.

11. The combination as set forth in claim 10 wherein each said cooper feed includes a terminal pin having a flat end; and a shield concentrically mounted on said pin and having a pair of slots therein; said shield having a pair of said straps received in a first of said slots and a third of said straps received in a second of said slots.

12. The combination as set forth in claim 11 further comprising a pair of screws, each said screw being threaded into said shield of a respective cooper feed and passing through a respective strap assembly and said flat end of a respective pin to secure said respective strap assembly to said shield and a respective pin.

* * * * *